United States Patent [19]

O'Toole

[11] Patent Number: 5,355,028
[45] Date of Patent: Oct. 11, 1994

[54] LOWER POWER CMOS BUFFER AMPLIFIER FOR USE IN INTEGRATED CIRCUIT SUBSTRATE BIAS GENERATORS

[75] Inventor: James E. O'Toole, Boise, Id.

[73] Assignee: Micron Technology, Inc., Boise, Id.

[21] Appl. No.: 965,801

[22] Filed: Oct. 23, 1992

[51] Int. Cl.⁵ ............................................. H03K 17/16
[52] U.S. Cl. .................................... 307/443; 307/451; 307/475
[58] Field of Search ............... 307/443, 446, 451, 475, 307/296.2

[56] References Cited

U.S. PATENT DOCUMENTS

| | | | |
|---|---|---|---|
| 4,103,188 | 7/1978 | Morton | 307/446 X |
| 4,563,594 | 1/1986 | Koyama | 307/443 X |
| 4,818,901 | 4/1989 | Young et al. | 307/443 X |
| 4,920,280 | 4/1990 | Cho et al. | 307/296.2 |
| 4,961,007 | 10/1990 | Kumanoya et al. | 307/296.2 |
| 5,061,864 | 10/1991 | Rogers | 307/443 |
| 5,120,992 | 6/1992 | Miller et al. | 307/443 X |

*Primary Examiner*—David R. Hudspeth
*Attorney, Agent, or Firm*—Angus C. Fox, III

[57] ABSTRACT

A complementary MOS buffer and amplifier stage is described herein and is useful for operation in a pump circuit of the type where an integrated circuit substrate is driven above Vcc or below ground potential. This operation serves to minimize parasitic capacitance loading and stabilize MOS device thresholds and consumes very little power. The CMOS buffer and amplifier stage includes first and second complementary input transistors cascaded to drive, respectively, first and second complementary output transistors, and lumped resistance means are connected in series between the first and second complementary input transistors and between the gate electrodes of the first and second complementary output transistors. The resistance means are operative in combination with the capacitance generated at the gate electrodes of the first and second output transistors to generate a circuit time constant that turns one of the first and second complementary output transistors completely off before the other complementary output transistor turns on. This operation completely eliminates crossover currents in the output of the buffer and amplifier stage which would otherwise represent undesirable power losses in the circuit. Advantageously, the resistance means, R, is provided in a preferred embodiment of the invention using one or more long channel MOS transistors connected between the gate electrodes of the first and second complementary output transistors and these devices operate in such a manner as to minimize parasitic capacitance introduced across the resistance means when the buffer and amplifier stage is switched from one to the other of its two conductive states.

24 Claims, 4 Drawing Sheets

1

LOWER POWER CMOS BUFFER AMPLIFIER FOR USE IN INTEGRATED CIRCUIT SUBSTRATE BIAS GENERATORS

TECHNICAL FIELD

This invention relates generally to substrate bias generators for integrated circuits and more particularly to such generators having improved low power dissipation capabilities.

BACKGROUND ART

In the manufacture of certain types of integrated circuits, such as high device density, dynamic random access memories (DRAMs), and static random access memories (SRAMs), it has been a common practice to use pump circuits in the IC substrate in order to generate bias voltages above the +5 volt Vcc IC supply voltage and below ground potential, or above and below the two rails of logic swing commonly used for switching the integrated circuit between two digital levels of logic. These large voltage swings beyond the two rails of logic are useful in optimizing the biasing and switching of memory circuits such as SRAMs and DRAMs fabricated within an integrated circuit chip.

For example, certain ones of the above identified SRAMs and DRAMs are fabricated on P-type substrates wherein active devices are formed by making N-type diffusions or ion implantations into the P-type substrate, thereby forming P-N junctions in the substrate which present a parasitic capacitance that must be compensated for during circuit operation. Thus, it has been a common practice to apply a negative potential to the P-type substrate to thereby reverse bias the above described P-N junctions to increase their depletion width and thereby decrease their junction capacitance accordingly. This has been done by applying a negative potential generated by the above pump circuits to the P-type substrate to in turn provide this reverse biasing effect. This biasing also improves MOS device threshold control.

One type of pump circuit which has been used to provide the above rail to rail switching and pumping action utilizes a ring oscillator cascaded to an output driver stage which is in turn capacitively coupled to drive the substrate below ground potential. Typically, the ring oscillator and the driver stage will include a plurality of complementary connected P-channel and N-channel MOS field effect transistors which are connected between input and output terminals for a given CMOS switching cell. Each such cell will normally include at least one P-channel MOS transistor and one N-channel MOS transistor connected in series between the Vcc power supply and ground potential. The gates of the P-channel and N-channel devices are connected to a common input terminal, and the drain of the P-channel device and the drain of the N-channel device are connected to a common output terminal.

A significant operational disadvantage characteristic of the above P-channel/N-channel two transistor cell is that one of the output P-channel or N-channel devices does not completely turn off before the other output device turns on. This in turn produces a so called crossing or crossover current which represents wasted power dissipation for the pump circuit. This operational disadvantage has in the past been mitigated to some degree by the use of so called long channel complementary transistors connected in series with the above P-channel and N-channel transistors, thereby converting the two transistor switching cell to a four transistor switching cell. These long channel MOS devices thus increased the impedance in series with the primary P-channel and N-channel MOS devices and thereby reduced the level of crossing current within the circuit. However, these long channel MOS devices in turn added a significant degree of parasitic capacitance in series with the primary P-channel and N-channel devices, and this in turn not only decreases frequency response of the pump circuit, but it also adds to the capacitive load driving requirements and power supply requirements for the pump circuit.

Accordingly, it is the solution to the above problems of crossover current and increased parasitic capacitance to which the present invention is directed.

DISCLOSURE OF INVENTION

In accordance with the present invention, it has been discovered that both the above problems of crossing or crossover current and increased parasitic capacitance of inverting and non-inverting CMOS circuits of the prior art can be eliminated by the provision of a novel, resistance compensating circuit in which P-channel and N-channel input MOS transistors are cascaded to P-channel and N-channel output MOS transistors, respectively. The drain of the P-channel input transistor is connected to the gate of the P-channel output transistor, and the drain of the N-channel input transistor is connected to the gate of the N-channel output transistor. More importantly, however, is the fact that a lumped resistance element, R, is connected in series between the drain of the P-channel input transistor and the drain of the input N-channel transistor and is further connected between the two gate electrodes, respectively, of the P-channel and N-channel output transistors. This lumped resistance element, R, operates to ensure that the output P-channel and N-channel MOS transistors are never conducting at the same time, thereby completely eliminating the above problem of crossing currents. Equally important, however, is the fact that the lumped resistance element, R, is constructed in such a manner as to add an insignificant amount of parasitic capacitance to the circuit, thereby further minimizing its wasted power dissipation in charging parasitic capacitance.

Accordingly, the general purpose and principal object of the present invention is to provide a new and improved MOS amplifier and buffer circuit of the type described which eliminates crossover currents of complementary output P-channel and N-channel switching devices, while simultaneously minimizing parasitic capacitance in the circuit and also minimizing power drain therein.

Another object of this invention is to provide a new and improved MOS switching circuit of the type described which is adaptable for use with a wide variety of inverter and logic type switching circuits which are more particularly described below with reference to the accompanying drawings.

A novel feature of this invention as broadly claimed herein is the provision of a new and improved complementary transistor buffer stage of the type described comprising first and second complementary input transistors cascaded to drive, respectively, first and second complementary output transistors. Resistance means are connected in series between the first and second complementary input transistors and between the gate electrodes of said first and second complementary output transistors. This resistance means is operative in combination with the capacitance generated at the gate electrodes of the output transistors to in turn produce a circuit time constant sufficient in magnitude to turn one of the first and second complementary output transistors substantially off before the other complementary output transistor turns on, thereby eliminating crossover currents in the first and second output transistors.

Another novel claimed feature of this invention is the provision of a new and improved pump circuit for an integrated circuit substrate operative for driving a semiconductor substrate below ground potential for reducing substrate parasitic capacitance. The pump circuitry includes, in combination: a capacitor connected between first and second nodes for receiving an input drive signal at the first node; a first diode connected between the second node and ground potential; a second diode connected between the second node and the substrate; and buffer and driver means connected to the first node and having complementary P-channel and N-channel output transistors connected to the first node and being operatively switched so that the P-channel and N-channel output transistors do not conduct at the same time. Thus, negative going voltage swings at the first node are capacitively coupled into the second node and through the second diode to drive the substrate below ground, and thereby provide reverse biasing of P-N junctions in the substrate. In this manner, parasitic capacitance in the substrate P-N junctions is minimized.

Another novel claimed feature of this invention is a new and improved ring oscillator including a plurality of odd numbered inverter stages connected in cascade for providing output drive signals useful in various integrated circuit applications, such as for driving pump circuits. This ring oscillator is characterized in that each inverter stage comprises buffer and drive means including first and second complementary input transistors cascaded to drive, respectively, first and second complementary output transistors. Resistance means are connected in series between the first and second complementary input transistors and between the gate electrodes of the first and second complementary output transistors, and these resistance means are operative in combination with the capacitance generated at the gate electrodes of the output transistors to in turn produce a circuit time constant sufficient in magnitude to turn one of the first and second complementary output transistors off before the other complementary output transistor turns on. This novel circuit arrangement eliminates crossover currents in the first and second output transistors.

The above brief summary of the invention, together with its attendant objects, advantages, and other novel features, will become better understood with reference to the following description of the accompanying drawings.

DETAILED DESCRIPTION OF THE DRAWINGS

Figure 1A:
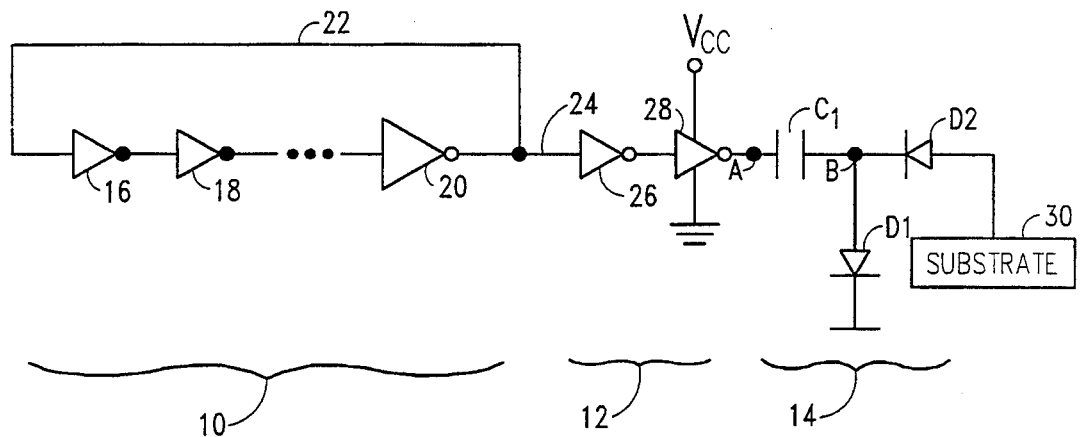
FIG. 1A is a schematic electrical diagram showing the construction of a pump circuit within the substrate of an integrated circuit. This is the type of pump circuit in which the present inventive circuits will be useful.

Referring now to FIG. 1A, there is shown a simplified diagram of a prior art substrate pump circuit which includes a ring oscillator stage 10 connected to an output driver stage 12 which in turn is capacitively coupled to a pump output stage 14. The input ring oscillator stage 10 will typically include a chosen odd number of cascaded inverter circuits 16, 18, and 20 around which is connected a feedback loop 22 to provide the required oscillating output signal on line 24 as an input signal to the two cascaded current driver stages 26 and 28. The output of the current driver stage 28 at node A is capacitively coupled through a capacitor C1 to node B at the intersection of a first diode D1 connected to ground and a second diode D2 connected to the substrate 30.

In one switching state, the node A will be connected through the buffer amplifier 28 to a potential Vcc of about 5 volts, and node B will be clamped to one diode voltage drop above ground potential. When the circuit in FIG. 1 is switched to its other conductive state where node A is driven towards ground potential, this action pushes node B to a negative potential of about minus 4 volts, thereby reverse biasing diode D1, turning diode D2 on, and pulling charge out of the substrate 30 as it drives the substrate 30 to a negative potential below ground. As previously indicated, this operation of driving the substrate 30 to a negative potential below ground operates to reverse bias the P-N junctions therein and decrease the parasitic capacitance of these P-N junctions by increasing the width of the P-N junction depletion regions. This switching action also reduces MOS device threshold variations.

Figure 1B:
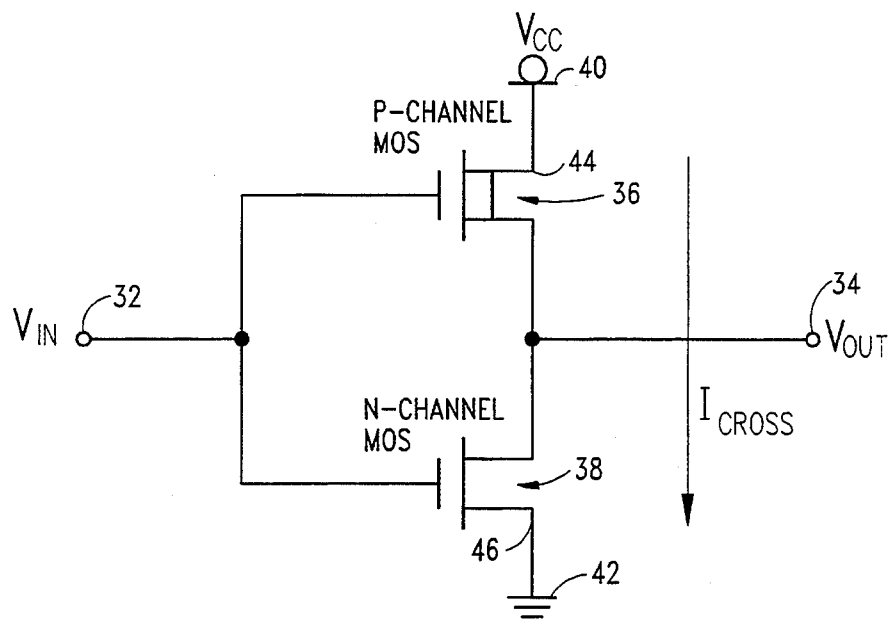
FIG. 1B is a schematic diagram of a simple two transistor MOS switching cell of the prior art which has been used in significant numbers in both the oscillator and driver stages of the schematic diagram of FIG. 1A.

Referring now to FIG. 1B, there is shown a basic prior art complementary P-channel/N-channel MOS transistor switching cell connected between an input terminal 32 and an output terminal 34. This basic cell includes a P-channel MOS transistor 36 connected in series with an N-channel MOS transistor 38 between a source of Vcc supply potential at terminal 40 and ground potential at terminal 42. This particular P-channel/N-channel complementary switching cell has been used for many years in the construction of the various inverter and driver stages identified above in FIG. 1A. This cell operates in such a manner that the P-channel MOS transistor 36 is never fully turned off before the N-channel transistor 38 turns on, thereby producing a so called crossing or crossover current indicated by the arrow 44. This crossover or crossing current represents wasted power by the cell and can result in considerable wasted power dissipation when considering the fact that many of these cells are used in the construction of the functional block diagram pump system shown in FIG. 1A.

In an effort to minimize the level of this crossover current in prior art switching cells of the type shown in FIG. 1B, modified MOS switching circuitry has been developed wherein one or more so called long channel MOS devices (not shown) have been connected between the source 44 of the P-channel transistor 36 and Vcc and the source of the N-channel transistor 38 and ground potential. This addition has been made in order to increase the series resistance between Vcc and ground potential and thereby reduce the level of crossover current during the switching of the cell from one to the other of its two logical states. However, the disadvantage with using this technique of adding long channel MOS devices in the series circuit between Vcc and ground is that the substantial channel capacitance of the long channel devices must be charged and discharged during the switching operation, and this contributes to the current demands of the circuit.

Figure 2A:
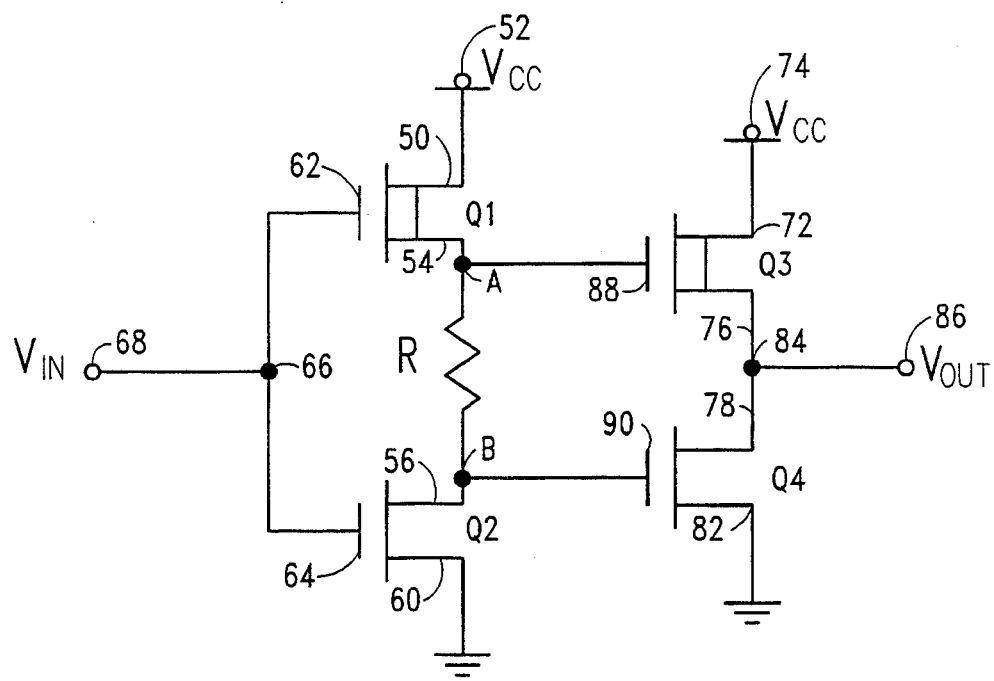
FIG. 2A is a schematic diagram of a four transistor switching circuit according to the present invention.
Figure 2B:
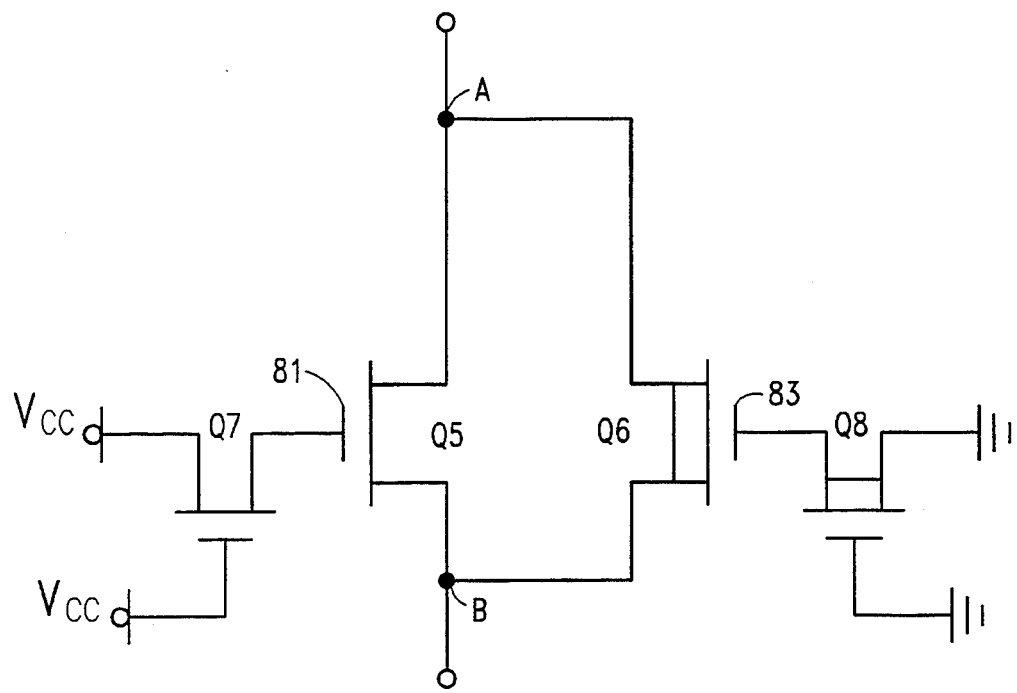
FIG. 2B shows a preferred integrated circuit implementation of the lumped constant resistance element, R, in FIG. 2A.

Referring now to a preferred embodiment of the present invention as illustrated in FIGS. 2A and 2B, this circuit has the unique and novel ability to: (1) totally eliminate any crossover or crossing current in the output complementary switching devices, while (2) simultaneously adding negligible parasitic capacitance to the circuit and thereby further minimizing its power dissipation and capacitive load driving requirements. In FIG. 2A, a first or P-channel MOS transistor Q1 has its source electrode 50 connected to a source of Vcc supply potential 52 and its drain electrode 54 connected to a lumped series resistance, R. The other side of the series resistance, R, is connected to the drain electrode 56 of a second or N-channel MOS transistor Q2, and the source electrode 60 of the N-channel MOS transistor Q2 is connected to ground potential. The gates 62 and 64 of the P-channel and N-channel transistors Q1 and Q2, respectively, are tied together at node 66 and are connected to receive an input switching voltage, $V_{IN}$, at the input terminal 68.

The circuit of FIG. 2A further includes a pair of complementary connected output transistors including a first or P-channel output transistor Q3 having its source electrode 72 connected to a Vcc voltage supply 74 and its drain electrode 76 connected to the drain electrode 78 of a second or N-channel MOS transistor Q4. The source 82 of the MOS transistor Q4 is connected to ground potential, and the drain electrodes of the two output switching transistors Q3 and Q4 are tied together at the output node 84 which connects to an output voltage terminal 86 from which an output digital logic signal $V_{OUT}$ may be derived. The gate 88 of the P-channel output MOS transistor Q3 is connected to the drain 54 of the input P-channel transistor Q1, whereas the gate 90 of the second output switching transistor Q4 is connected to the drain 56 of the second input transistor Q2. Thus, the lumped resistance, R, is also connected directly between the gates 88 and 90 of the two output MOS transistors Q3 and Q4.

The circuit of FIG. 2A can use the smallest producible MOS devices with a minimum channel length, L, and channel width, W. Moreover, the circuit configuration in FIG. 2A has virtually no crossover current, and is non-inverting in that the switching signal $V_{OUT}$ goes high in response to $V_{IN}$ going high, and $B_{OUT}$ switches low in response to $V_{IN}$ switching low. More particularly, when $V_{IN}$ is at ground potential, transistor Q1 is on and node A is high, turning transistor Q3 off. During this time, transistor Q2 is turned off, allowing node B to pull high, and transistor Q4 is turned on, so that the output signal $V_{OUT}$ is at ground potential. Conversely, when $V_{IN}$ switches from ground to Vcc, Q1 turns off while Q2 turns on, and this switching action has the effect of driving node A low to turn on Q3, turning off Q4 and switching $V_{OUT}$ to Vcc.

The resistance value of R in FIG. 2A is high enough so that when $V_{IN}$ switches high, node B immediately switches low, thereby turning off Q4. Node A on the other hand responds more slowly, since it must discharge through resistance R. The time constant of node A is set so that when node A reaches Vcc minus the $V_{TP}$ threshold voltage of Q3 (i.e. when Q3 turns on), node B is already below the $V_{TN}$ threshold voltage on Q4 (i.e. Q4 is already off). This feature ensures that there is no crossing current in Q3 and Q4. However, a small crossing current will occur in Q1 and Q2, but it is severely limited by the value of resistance R. Once Q3 turns on, $V_{OUT}$ switches high.

When $V_{IN}$, switches from high to low, Q1 immediately drives node A high, thereby turning off Q3. At this time, node B charges more slowly through the resistance R. Again, the time constant of node B is set such that node A is at or above Vcc minus the $V_{TP}$ of Q3 (i.e. Q3 is off) before node B rises above the $V_{TN}$, threshold voltage of Q4, at which time Q4 turns on. Once Q4 is turned on, $V_{OUT}$ switches from high to low.

Referring now to FIG. 2B, there is shown a unique and novel equivalent circuit implementation of the lumped resistance R in FIG. 2A. If one were to attempt to develop an integrated circuit resistor of a given length and width of area on a silicon chip, the large value of R required might require far more silicon chip area than is reasonably available, and this is the reason for the novel circuit implementation for resistance R as shown in FIG. 2B. The equivalent circuit for R in FIG. 2B includes parallel connected long channel MOS transistors Q5 and Q6 connected in parallel between nodes A and B which of course correspond to nodes A and B in the circuit of FIG. 2A. This lumped value circuit further includes two outside transistors Q7 and Q8 connected as shown between the gates 81 and 83 of the long channel MOS transistors Q5 and Q6 and between a Vcc supply voltage at transistor Q7 and ground potential which is connected to transistor Q8.

The resistance circuit in FIG. 2B operates as follows: If the input signal $V_{IN}$ in FIG. 2A changes from 0 from 5 volts, this change in voltage is capacitively coupled from the source to gate and drain to gate of Q5. This has the effect of introducing very little stray capacitance into node A and maintaining nearly constant channel resistance. Similarly, when the input voltage $V_{IN}$ in FIG. 2A makes a swing from 5 volts to ground, this approximate 5 volt change in voltage is capacitively coupled between the source and gate and the drain and gate of the long channel transistors Q5 and Q6 and similarly has the effect of introducing very little stray capacitance at nodes A and B. This switching action ensures that this capacitance coupled voltage change tracks the input voltage swing between the source and gate and drain and gate of Q5 and Q6. Thus, the circuit in FIG. 2B operates to provide the desired high resistance component between nodes A and B during the above described switching operation of the circuit of FIG. 2A by ensuring that the long channel devices Q5 and Q6 are turned on during each switching cycle. However, this switching operation also simultaneously ensures that the capacitive coupling action described above introduces negligible stray capacitance into the nodes A and B of FIG. 2B which must be charged or discharged during circuit switching operation. This stray capacitance, if considerable, would otherwise not only slow the transient response (and thus limit the frequency of a ring oscillator) of the circuit in FIG. 2A, but it would also increase the driving current demanded by the circuit 2A.

In summary, therefore, the use of the minimum geometry MOS devices and the virtual elimination of crossing currents and stray capacitance make the circuit of FIG. 2A a very desirable and attractive low power buffer stage. This stage has a minimum switching delay primarily determined by the minimum value of the resistance R required to eliminate the crossing currents as described above. This delay is adjustable above the minimum value by increasing the value of R. The above design of R implemented with the bootstrapping pass gates shown in FIG. 2B provides a nearly constant turn on voltage of Q5 and Q6 for the circuit in FIG. 2A, and the driven capacitance of these structures is very small.

Figure 3A:
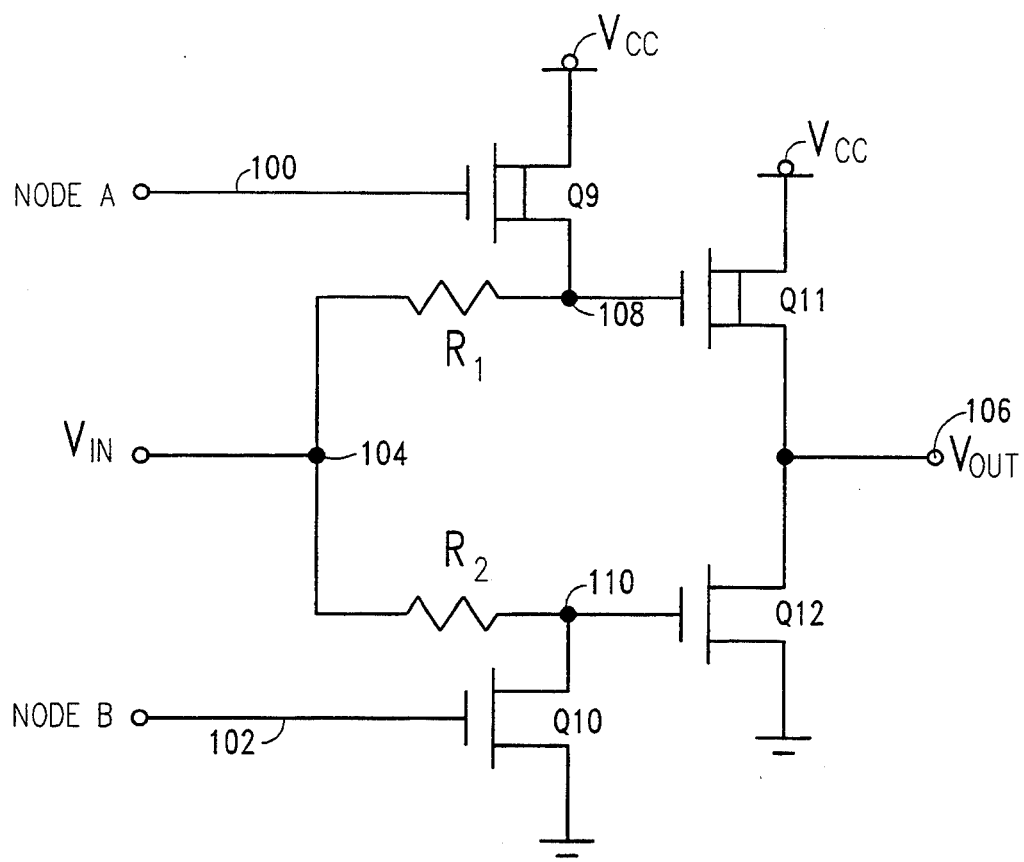
FIGS. 3A and 3B are schematic diagrams, respectively, of two different inverting buffer amplifiers in which the circuit of FIG. 2A embodying the invention will also be useful.
Figure 3B:
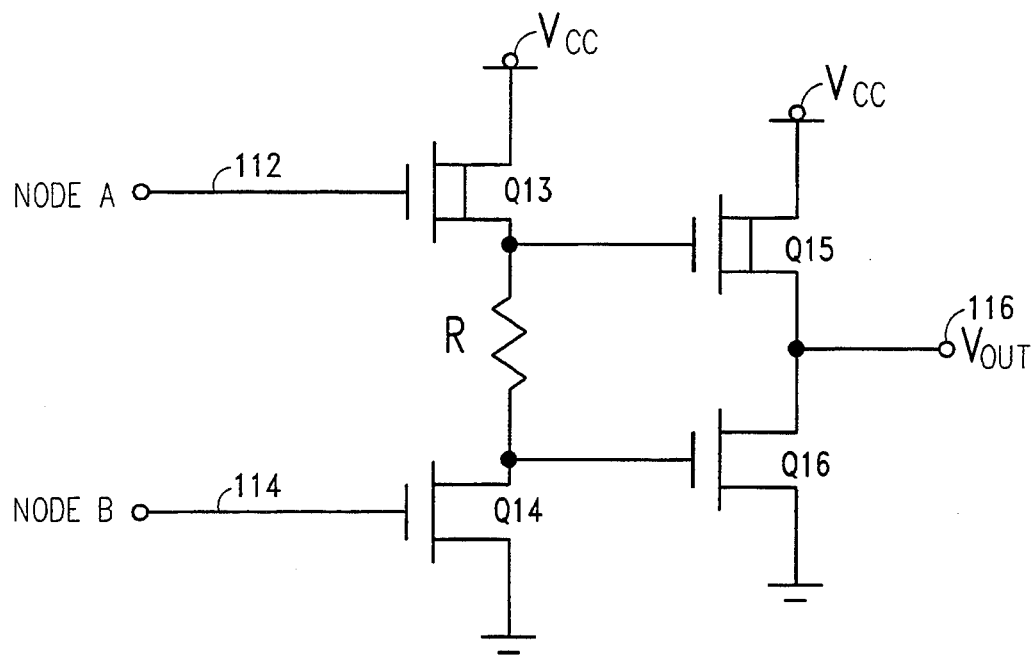

Referring now to FIGS. 3A and 3B, these circuits represent two versions of a CMOS inverter, and both circuits are assumed to be driven by non-inverting stages of the type shown in FIG. 2A above. The first inverter circuit in FIG. 3A includes a pair of input complementary MOS devices Q9 and Q10 connected, respectively, to nodes A and B from the previous stage by way of lines 100 and 102. The input devices Q9 and Q10 are connected as shown in series with a pair of lumped constant resistors R1 and R2, each of which are constructed in accordance with FIG. 2B above. These resistances R1 and R2 are connected at a common input node 104 to receive the input signal $V_{IN}$ which is to be inverted by this circuit. The circuit of FIG. 3A further includes a pair of complementary CMOS output transistors Q11 and Q12 connected as shown to an output terminal 106, and the nodes 108 and 110 in FIG. 3A are analogous to nodes A and B in FIGS. 2A and 2B above.

In operation, assume that node A on line 100 is low and that node B on line 102 is low initially, and further assume that $V_{IN}$ at node 104 is high. Under these conditions, transistor Q9 will be turned on, node 108 will be high, transistor Q11 will be turned off and the output node 106 will be low, thereby converting the high level input signal $V_{IN}$ at node 104 to a low level output signal $V_{OUT}$ at the output node 106. Under these conditions, node 102 will be low, allowing the resistance R to drive node 110 high and also driving the output MOS transistor Q12 to conduction.

Now, when $V_{IN}$ switches from high to low, the above conductive conditions for all of the transistors Q9, Q10, Q11, and Q12 in FIG. 3A reverse themselves as will be understood by those skilled in the art so as to now invert a low $V_{IN}$ at the input node 104 to a high $V_{OUT}$ at the output node 106. The lumped resistances of both R1 and R2 function identical to the operation of the circuit described in FIG. 2B above.

Referring now to FIG. 3B, the inverter circuit in this figure includes a pair of input MOS transistors Q13 and Q14 connected in series through resistance R in a manner described above and further connected via lines 112 and 114, respectively, to nodes A and B from the previous stage. The drain of Q13 is connected to drive the gate of a first P-channel output transistor Q15, and similarly the drain of Q14 is connected to drive the gate of a second N-channel output transistor Q16. The drain of Q15 and the drain of Q16 are connected at a common output node 116 from which a $V_{OUT}$ output signal is derived.

Figure 4A:
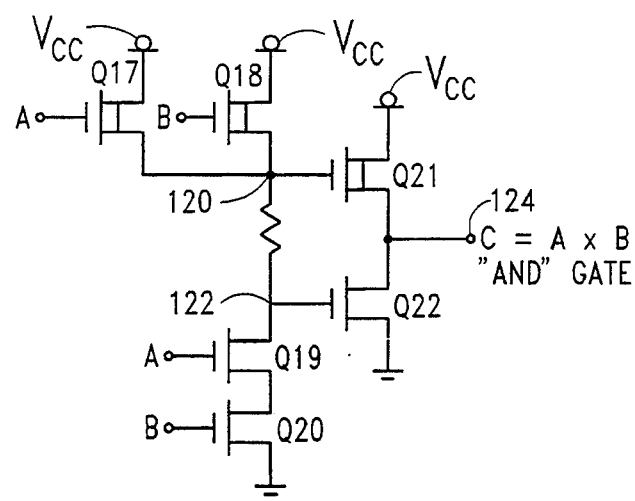
FIGS. 4A, 4B, and 4C show, respectively, an "AND" gate, an "OR" gate, and inverter circuit which may also incorporate the novel circuitry of FIG. 2A above in the implementation of these well known logic functions which will be described herein.
Figure 4B:
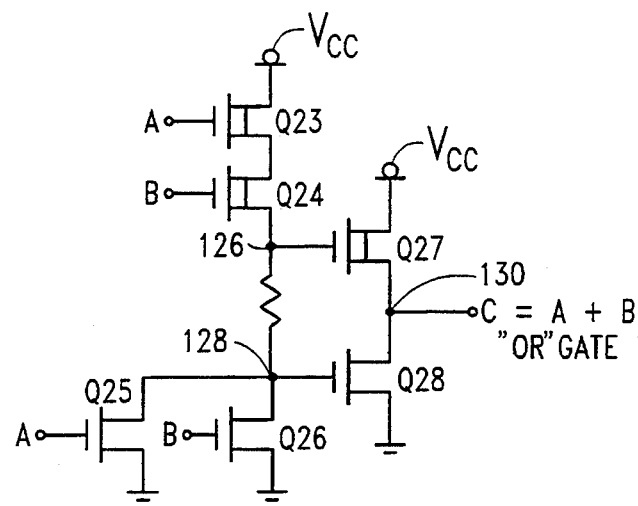
Figure 4C:
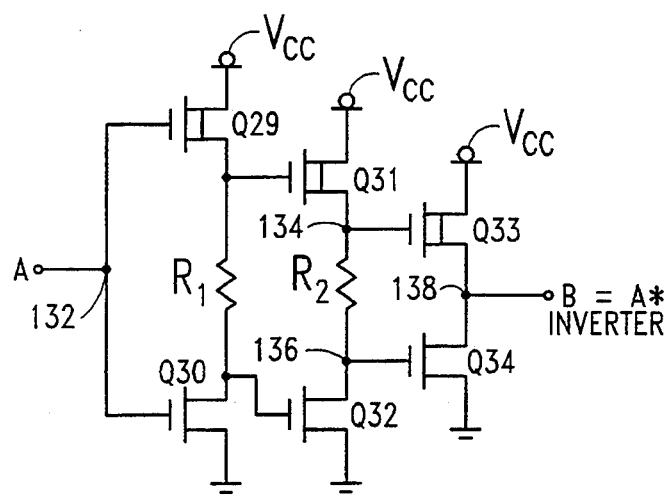

Referring now in sequence to the two logic circuits shown in FIGS. 4A and 4B and then to the inverter shown in FIG. 4C, FIG. 4A is a schematic diagram of a "AND" logic circuit comprising parallel connected P-channel input transistors Q17 and Q18 connected between Vcc and node 120 on one side of the resistance R and a pair of series connected N-channel transistors Q19 and Q20 connected as shown in series between node 122 and ground potential. A first, output P-channel transistor Q21 is connected as shown to node 120 at the drain of Q18, and a second, N-channel output transistor Q22 is connected as shown to node 122 at the drain of the N-channel transistor Q19.

The AND gate in FIG. 4A thus operates as follows: If either the A or the B inputs at the gates of Q17 and Q18, respectively, are low, node 120 will be driven high, turning off Q21 and producing a low output signal C at the circuit output terminal 124. During this time, at least one of Q19 and Q20 are turned off, node 122 is high, thereby driving Q22 to conduction and pulling the output terminal 124 to ground potential. When the A and B signals at the gates of Q17, Q18, Q19, and Q20 are both high, the gate of Q22 switches low to turn off Q22 and turn on Q21 and drive node 124 high to Vcc, thereby reversing the conductive state of the AND gate in FIG. 4A.

Referring now to the "OR" logic gate in FIG. 4B, this circuit includes first and second series connected input P-channel transistors Q23 and Q24 connected as shown between Vcc and node 126 at one side of the resistance element R. A pair of N-channel MOS transistors Q25 and Q26 are connected in parallel between node 128 and ground potential. A first, P-channel output transistor Q27 is connected between Vcc and output node 130, and a second, N-channel output transistor Q28 is connected between output node 130 and ground potential.

The OR gate circuit in FIG. 4B operates as follows: If both the A and B signals at the gates of Q23 and Q24 are low, both transistors Q23 and Q24 will be turned on, driving node 126 high, turning off Q27 and turning on Q28 to drive the output node 130 low to ground potential. Similarly, if either or both A and B are driven high, then at least one of the transistors Q25 and Q26 will be driven to conduction, thereby pulling node 128 low, turning off output transistor Q28, turning on output transistor Q27 and driving node 130 high.

Referring now to the inverter circuit shown in FIG. 4C, this complementary MOS transistor stage includes first and second, P-channel and N-channel transistors Q29 and Q30 having their gates tied together at the input terminal 132 and having their drains connected through a resistance element R of the type described in FIG. 2B above. The circuit in FIG. 4C further includes an intermediate stage consisting of complementary MOS transistors Q31 and Q32 also connected in series through a FIG. 2B resistance element R and between Vcc and ground potential. The drain of Q31 is connected at node 134 to drive the gate of a first P-channel output transistor Q33; the gate of Q34 is connected to node Q36 at the drain of Q32; and the two complementary output MOS transistors are tied together at the output terminal 138.

The circuit of FIG. 4C performs the inversion function in the following manner: If input voltage level A is low at node 132, Q29 will be turned on, driving the gate of Q31 high and turning off Q31. This switching action in turn means that the gate of the output transistor Q33 at node 134 is pulled low, by Q32 through R2 thereby turning on Q33 and driving the output node 134 to Vcc, or to a high logical level. During this time, Q30 is turned off, Q32 is turned on, and Q34 is turned off.

Now, when the input signal A at node 132 switches from low to high, Q29 turns off, Q31 turns on, and Q33 turns off, thereby driving node 138 low as Q34 is driven to conduction by Q31 through R2. The two resistors R1 and R2 in FIG. 4C perform in a manner described above with reference to FIGS. 2A and 2B and will not be described in further detail herein.

Various modifications may be made in and to the above described embodiments without departing from the spirit and scope of this invention. For example, whereas this description has focused on a low power ring oscillator with buffer stages optimized for this particular pump circuit application, these same buffer stages can be built with non-minimum MOS devices and can be used in any buffer application. These types of circuits can be used, for example, to drive a large capacitive load with no crossing current. In fact, such a stage is used to drive the pump capacitor in the substrate pump shown in FIG. 1. In addition, whereas the discussion above assumes CMOS technology, the same principles of operation would apply to any technology using complementary devices.

Finally, it should be understood that the above described inverter stages and logic stages are merely exemplary of many types of inverter and logic stages which may take advantage of the operation of the lumped constant resistor constructed in either the novel manner shown in FIG. 2B herein or in some other manner. Accordingly, these and other modifications are clearly within the scope of the following appended claims.

I claim:

1. A complementary transistor buffer stage for use in a variety of integrated circuits comprising:
   (a) first and second complementary input field-effect transistors cascaded to drive, respectively, first and second complementary output field-effect transistors; and
   (b) at least two complementary long-channel field-effect transistors which are coupled in series between said first and second complementary input transistors and between the gate electrodes of said first and second complementary output transistors, said long-channel transistors being operative in combination with the capacitance generated at said gate electrodes to, in turn, produce a circuit time constant sufficient in magnitude to turn one of said first and second complementary output transistors substantially off before the other complementary output transistor turns on, thereby eliminating crossover currents in said first and second output transistors; and
   (c) an N-channel diode, which couples the gate of the long-N-channel field-effect transistor to a power supply bus, and a P-channel diode, which couples the gate of the long-P-channel field-effect transistor to a ground bus, thereby producing a bootstrapping effect on the gates of said long-channel so that fluctuations in conductance through said long-channel transistors is minimized as voltage across said long-channel transistors varies, and thereby minimizing the driven capacitance of the gates of said long-channel transistors.

2. The buffer stage defined in claim 1 wherein the gate electrodes of said first and second complementary input transistors are connected to a common input terminal for receiving a signal, $V_{IN}$, and generating a non-inverted signal $V_{OUT}$ at a common output connection for said first and second complementary output transistors.

3. The buffer stage defined in claim 1 wherein said first and second input transistors are connected individually to separate nodes of a preceding stage, whereby said circuit is operative to invert the level of $V_{IN}$ to a different level of $V_{OUT}$ at an output terminal and further wherein an resistance means includes:
   a. a first lumped resistance element connected between said gate electrode of said first output transistor and a common input node for receiving an input signal $V_{IN}$, and
   b. a second lumped resistance element connected between said gate electrode of said second output transistor and said common input node for receiving $V_{IN}$.

4. The circuitry defined in claim 1 which includes a first logic input transistor connected in parallel with said first input transistor and a second logic input transistor connected in series with said second input transistor, whereby said first and second input logic transistors are operative to receive logic signals and thereby generate an OR gate function.

5. The circuitry defined in claim 1 which further includes a first logic input transistor connected in series with said first input transistor and a second logic input transistor connected in parallel with said second input transistor, whereby said first and second logic input transistors enable said circuitry to function as an AND gate.

6. The circuitry defined in claim 1 which further includes an intermediate complementary transistor stage connected between said first and second complementary input transistors and said first and second complementary output transistors, said intermediate stage including a first conductivity type MOS transistor connected between a voltage supply terminal and a resistance means, and a second MOS transistor of different conductivity type connected between said resistance means and ground potential for enabling said circuitry to operate as an inverter when the gates of said first and second input transistors are connected to a common input terminal.

7. A non-inverting signal driver circuit comprising:
   (a) P-channel and N-channel input field-effect transistors, each having a source, a drain, an insulated gate and a channel, the source of the P-channel input transistor being coupled to a power supply bus, and the source of the N-channel input transistor being coupled to a ground bus;
   (b) P-channel and N-channel output field-effect transistors, each having a source, a drain, an insulated gate and a channel, the source of the P-channel output transistor being coupled to a power supply bus, and the source of the N-channel output transistor being coupled to a ground bus, the gate of the P-channel output transistor being coupled to the drain of the P-channel input transistor, and the gate of the N-channel output transistor being coupled to the drain of the N-channel input transistor;

(c) an input node coupled to the gates of both the N-channel input transistor and the P-channel input transistor;

(d) an output node coupled to the drains of both the P-channel and N-channel output transistors; and (e) at least one long-channel field-effect transistor, the channel of which couples the drain of the P-channel input transistor to the drain of the N-channel input transistor, said long-channel field-effect transistor operative as a resistance element.

8. The signal driver circuit of claim 7, wherein said at least one long-channel field-effect transistor comprises a long-N-channel, insulated-gate, field-effect transistor and a long-P-channel long-channel, insulated-gate, field-effect transistor, each of which is in an always-on state.

9. The signal driver circuit of claim 8, wherein the gate of the long-N-channel field-effect transistor is coupled to the power supply bus through an N-channel diode, and the gate of the long-P-channel field-effect transistor is coupled to the ground bus through a P-channel diode, thus providing a bootstrapping effect on the gates of said long-channel transistors so that fluctuations in conductance through said long-channel transistors is minimized as voltage across said long-channel transistors varies, and thus minimizing the driven capacitance of the gates of said long-channel transistors.

10. The signal driver circuit of claim 9, wherein the resistance provided by the pair of long-channel transistors is sufficient to ensure that both output transistors will not conduct simultaneously.

11. The non-inverting signal driver circuit of claim 10, in combination with an inverting signal driver stage, said inverting signal driver comprising:

(a) an input node coupled to the output node of said non-inverting signal driver circuit;

(b) a long-P-channel insulated-gate field effect transistor and a long-N-channel insulated-gate field effect transistor;

(b) P-channel and N-channel input field-effect transistors, each having a source, a drain, an insulated gate and a channel, the source of the P-channel input transistor being coupled to a power supply bus, the drain of the P-channel input transistor being coupled to said input node through said long-P-channel field-effect transistor, the gate of the P-channel input transistor being coupled to the drain of the P-channel input transistor of the non-inverting driver, the source of the N-channel input transistor being coupled to a ground bus, the drain of the N-channel input transistor being coupled to said input node through said long-N-channel field effect transistor, and the gate of the N-channel input transistor being coupled to the drain of the N-channel input transistor of the non-inverting driver, each of said long-channel field-effect transistors operative as a resistance element;

(c) P-channel and N-channel output field-effect transistors, each having a source, a drain, an insulated gate and a channel, the source of the P-channel output transistor being coupled to a power supply bus, the gate of the P-channel output transistor being coupled to the drain of the P-channel input transistor, the source of the N-channel output transistor being coupled to a ground bus, and the gate of the N-channel output transistor being coupled to the drain of the N-channel input transistor; and (d) an output node coupled to the drains of both the P-channel and N-channel output transistors.

12. The inverting signal driver stage of claim 11, wherein the gate of the long-N-channel field-effect transistor is coupled to the power supply bus through an N-channel diode, and the gate of the long-P-channel field-effect transistor is coupled to the ground bus through a P-channel diode, thus providing a bootstrapping effect on the gates of said long-channel transistors so that fluctuations in conductance through said long-channel transistors is minimized as voltage across said long-channel transistors varies, and thus minimizing the driven capacitance of the gates of said long-channel transistors.

13. The inverting signal driver stage of claim 12, wherein the resistance provided by the pair of long-channel transistors is sufficient to ensure that both output transistors never conduct simultaneously.

14. The non-inverting signal driver circuit of claim 13, in combination with an inverting signal driver stage so as to provide both a non-inverted output from the non-inverting signal driver circuit and an inverted output from the inverting signal driver stage, said inverting signal driver comprising:

(a) P-channel and N-channel input field-effect transistors, each having a source, a drain, an insulated gate and a channel, the source of the P-channel input transistor being coupled to a power supply bus, the drain of the P-channel input transistor being coupled to the drain of the N-channel input transistor through at least one long-channel field-effect transistor which functions as a resistive element, the gate of the P-channel input transistor being coupled to the drain of the P-channel input transistor of the non-inverting driver, the source of the N-channel input transistor being coupled to a ground bus, and the gate of the N-channel input transistor being coupled to the drain of the N-channel input transistor of the non-inverting driver;

(b) P-channel and N-channel output field-effect transistors, each having a source, a drain, an insulated gate and a channel, the source of the P-channel output transistor being coupled to a power supply bus, the gate of the P-channel output transistor being coupled to the drain of the P-channel input transistor, the source of the N-channel output transistor being coupled to a ground bus, and the gate of the N-channel output transistor being coupled to the drain of the N-channel input transistor; and (c) an output node coupled to the drains of both the P-channel and N-channel output transistors.

15. The inverting signal driver stage of claim 14, wherein said at least one long-channel field-effect transistor comprises a long-N-channel, insulated-gate, field-effect transistor and a long-P-channel long-channel, insulated-gate, field-effect transistor, each of which is in an always-on state.

16. The signal driver circuit of claim 15, wherein the gate of the long-N-channel field-effect transistor is coupled to the power supply bus through an N-channel diode, and the gate of the long-P-channel field-effect transistor is coupled to the ground bus through a P-channel diode, thus providing a bootstrapping effect on the gates of said long-channel transistors so that fluctuations in conductance through said long-channel transistors is minimized as voltage across said long-channel transistors varies, and thus minimizing the driven capacitance of the gates of said long-channel transistors.

17. The inverting signal driver stage of claim 16, wherein the resistance provided by the pair of long-channel transistors is sufficient to ensure that both output transistors never conduct simultaneously.

18. An inverting signal driver circuit comprising:
(a) P-channel and N-channel input field-effect transistors, each having a source, a drain, an insulated gate and a channel, the source of the P-channel input transistor being coupled to a power supply bus, and the source of the N-channel input transistor being coupled to a ground bus;
(b) P-channel and N-channel intermediate field-effect transistors, each having a source, a drain, an insulated gate and a channel, the source of the P-channel input transistor being coupled to a power supply bus, the gate of the P-channel intermediate transistor being coupled to the drain of the P-channel input transistor, the source of the N-channel input transistor being coupled to a ground bus, and the gate of the N-channel intermediate transistor being coupled to the drain of the N-channel input transistor;
(c) P-channel and N-channel output field-effect transistors, each having a source, a drain, an insulated gate and a channel, the source of the P-channel output transistor being coupled to a power supply bus, the gate of the P-channel output transistor being coupled to the drain of the P-channel intermediate transistor, the source of the N-channel output transistor being coupled to a ground bus, and the gate of the N-channel output transistor being coupled to the drain of the N-channel intermediate transistor;
(d) a first resistive element comprising at least one long-channel field-effect transistor, the channel of which couples the drain of the P-channel input transistor to the drain of the N-channel input transistor;
(e) a second resistive element comprising at least one long-channel field-effect transistor, the channel of which couples the drain of the P-channel intermediate transistor to the drain of the N-channel intermediate transistor;
(f) an input node coupled to the gates of both the N-channel input transistor and the P-channel input transistor; and
(g) an output node coupled to the drains of both the P-channel and N-channel output transistors.

19. The inverting signal driver circuit of claim 18, wherein said first and second resistive elements each comprise a long-N-channel, insulated-gate, field-effect transistor and a long-P-channel long-channel, insulated-gate, field-effect transistor, both of said complementary long-channel transistors comprising each resistive element being connected in parallel, and each of said long-channel transistors being in an always-on state.

20. The inverting signal driver circuit of claim 19, wherein the gate of each long-N-channel field-effect transistor is coupled to the power supply bus through an N-channel diode, and the gate of each long-P-channel field-effect transistor is coupled to the ground bus through a P-channel diode, thus providing a bootstrapping effect on the gates of said long-channel transistors so that fluctuations in conductance through said long-channel transistors is minimized as voltage across said long-channel transistors varies, and thus minimizing the driven capacitance of the gates of said long-channel transistors.

21. The inverting signal driver of claim 20, wherein the resistance provided by each of said long-channel transistors is sufficient to ensure that both output transistors never conduct simultaneously.

22. A resistance element for coupling the drains of a pair of complementary insulated-gate field-effect transistors used in a single driver stage of a multi-stage driver circuit, said pair of complementary transistors being series-coupled between a power supply voltage bus and a ground bus, and with the drain of each transistor providing a driven output to a subsequent stage of the driver circuit, said resistance element comprising both a long-N-channel, insulated-gate, field-effect transistor and a long-P-channel long-channel, insulated-gate, field-effect transistor, both of which are connected in parallel between the drains of said pair of complementary transistors, and both of which are in an always-on state.

23. The resistance element of claim 22, wherein the gate of the long-N-channel field-effect transistor is coupled to the power supply bus through an N-channel diode, and the gate of the long-P-channel field-effect transistor is coupled to the ground bus through a P-channel diode, thus providing a bootstrapping effect on the gates of said long-channel transistors so that fluctuations in conductance through said long-channel transistors is minimized as voltage across said long-channel transistors varies, and thus minimizing the driven capacitance of the gates of said long-channel transistors.

24. The resistance element of claim 22, wherein the driven outputs are coupled to the gates of a pair of complementary transistors in said subsequent stage, and the resistance provided by the long-channel transistors is sufficient to ensure that both complementary transistors in said subsequent state never conduct simultaneously.

* * * * *